United States Patent
Terauchi et al.

(10) Patent No.: US 11,251,768 B2
(45) Date of Patent: Feb. 15, 2022

(54) PIEZOELECTRIC DEVICE

(71) Applicant: KYOCERA Corporation, Kyoto (JP)

(72) Inventors: Yuuki Terauchi, Higashine (JP);
Motoharu Andou, Higashine (JP);
Yoshiaki Yokoo, Higashine (JP)

(73) Assignee: KYOCERA CORPORATION, Kyoto (JP)

( * ) Notice: Subject to any disclaimer, the term of this patent is extended or adjusted under 35 U.S.C. 154(b) by 227 days.

(21) Appl. No.: 16/552,194

(22) Filed: Aug. 27, 2019

(65) Prior Publication Data

US 2020/0136586 A1 Apr. 30, 2020

(30) Foreign Application Priority Data

Oct. 26, 2018 (JP) .............................. JP2018-202021

(51) Int. Cl.
*H03H 9/02* (2006.01)
*H03H 9/05* (2006.01)
*H03H 9/19* (2006.01)
*H03H 9/10* (2006.01)

(52) U.S. Cl.
CPC ...... *H03H 9/02102* (2013.01); *H03H 9/0509* (2013.01); *H03H 9/0552* (2013.01); *H03H 9/1021* (2013.01); *H03H 9/19* (2013.01)

(58) Field of Classification Search
CPC .... H03H 9/02102; H03H 9/0509; H03H 9/19; H03H 9/1021; H03H 9/0552; H03H 9/15; H03H 3/04; H03H 3/02; H03H 2003/0407; H03B 5/04; H03B 5/32
See application file for complete search history.

(56) References Cited

U.S. PATENT DOCUMENTS

| | | | |
|---|---|---|---|
| 6,229,249 B1 | 5/2001 | Hatanaka et al. | |
| 2015/0123737 A1* | 5/2015 | Yokoo | H03B 5/32 331/34 |
| 2016/0197594 A1* | 7/2016 | Hanzawa | H01C 7/008 310/348 |

FOREIGN PATENT DOCUMENTS

| | | |
|---|---|---|
| JP | 2000-138339 A | 5/2000 |
| JP | 2006-216735 A | 8/2006 |
| JP | 2015-091103 A | 5/2015 |
| JP | 2016-127467 A | 7/2016 |

\* cited by examiner

*Primary Examiner* — Jeffrey M Shin
(74) *Attorney, Agent, or Firm* — Volpe Koenig

(57) ABSTRACT

A piezoelectric device includes a piezoelectric element, a package, a temperature sensitive component and a conductive adhesive. The package includes a base body and a connection conductor. The base body has electric insulation and configures a space. The space is sealed and holds the piezoelectric element. The connection conductor is located on a predetermined surface of the base body. The predetermined surface is on an outer side relative to the space. The temperature sensitive component includes apart terminal and converts temperature to an electrical signal. The conductive adhesive is configured by a thermosetting resin containing a conductive filler and is bonded to the connection conductor and the part terminal.

20 Claims, 7 Drawing Sheets

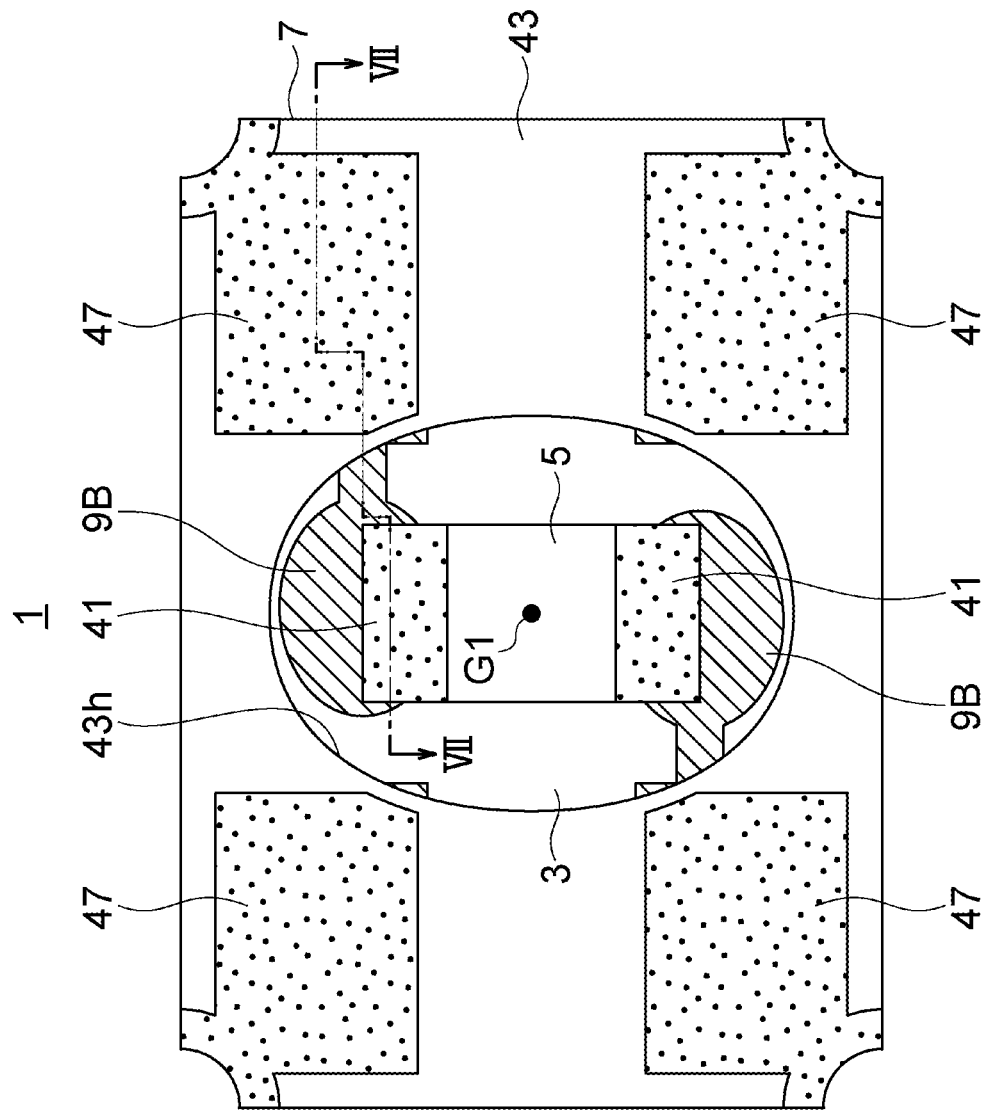
FIG.6
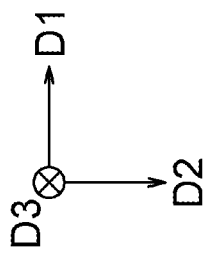

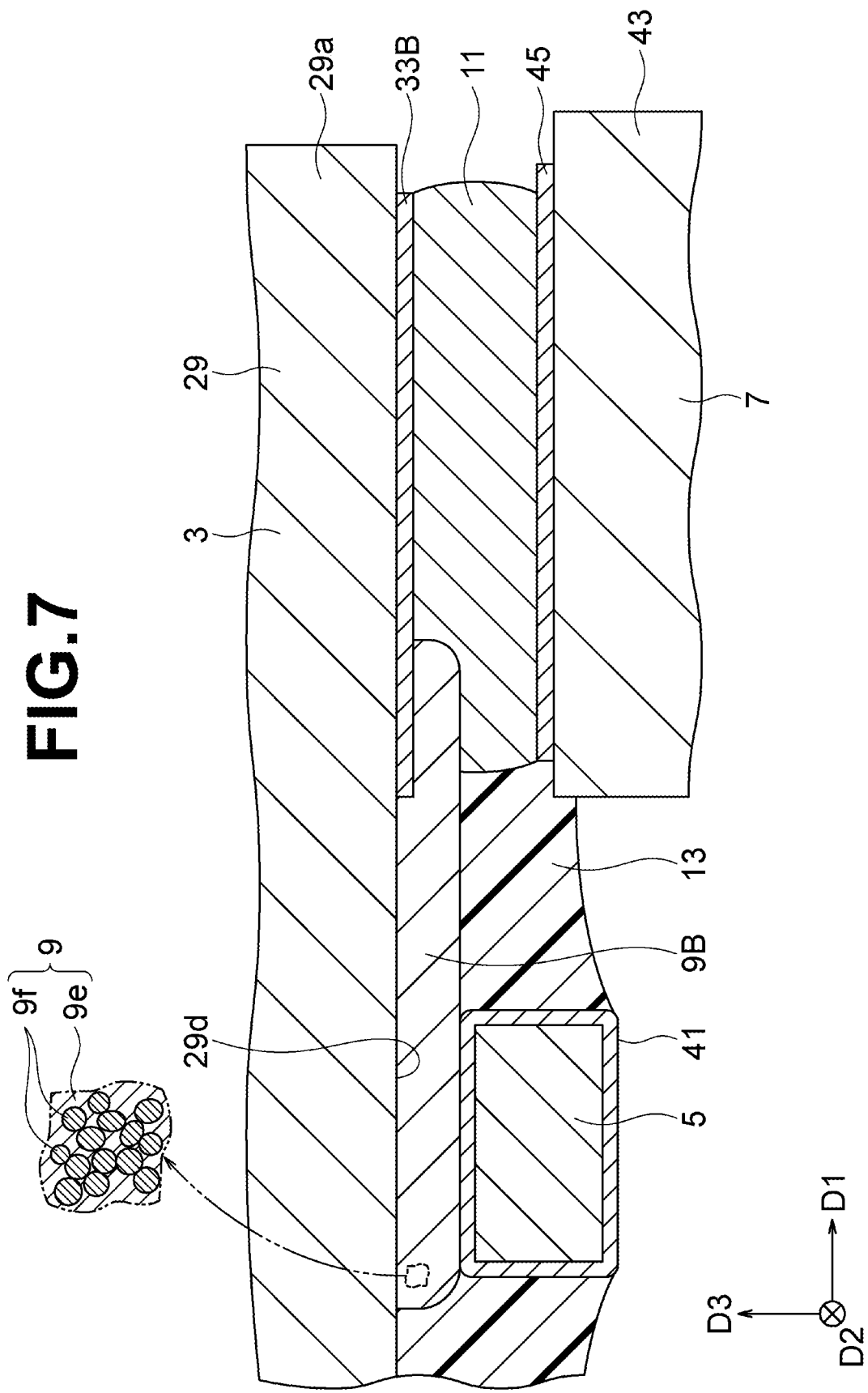

PIEZOELECTRIC DEVICE

TECHNICAL FIELD

The present disclosure relates to a crystal resonator (crystal unit) or crystal oscillator or another piezoelectric device.

BACKGROUND ART

As a piezoelectric device, there is known one having a so-called H-shaped package. This H-shaped package is integrally formed by ceramic or resin and has a recessed part provided in an upper surface and a recessed part provided in a lower surface. In the recessed part in the upper surface, for example, a vibration element (crystal element) comprised of a crystal blank on which excitation electrodes are provided is mounted. In the recessed part in the lower surface, another electronic element is mounted. The other electronic element is for example a thermister or integrated circuit.

Further, an alternative structure to the H-shaped package described above has been proposed (Patent Literature 1) as well. The piezoelectric device in Patent Literature 1 has a circuit board having an opening, a resonator mounted on the upper surface of the circuit board so as to cover the opening described before, and an electronic element which is held in the opening and is mounted on the lower surface of the resonator. The resonator has a vibration element and a package which holds the vibration element.

CITATION LIST

Patent Literature

Patent Literature 1: Japanese Patent Publication No. 2015-91103

SUMMARY OF INVENTION

A piezoelectric device according to one aspect of the present disclosure includes a piezoelectric element, a package, a temperature sensitive component and a conductive adhesive. The package includes a base body and a connection conductor. The base body has electric insulation and configures a space. The space is sealed and holds the piezoelectric element. The connection conductor is located on a predetermined surface of the base body. The predetermined surface is on an outer side relative to the space. The temperature sensitive component includes apart terminal and converts temperature to an electrical signal. The conductive adhesive is configured by a thermosetting resin containing a conductive filler and is bonded to the connection conductor and the part terminal.

BRIEF DESCRIPTION OF DRAWINGS

FIG. 6 is a bottom surface view of the crystal device in FIG. 1.

FIG. 7 is a cross-sectional view corresponding to the VII-VII line in FIG. 6.

DESCRIPTION OF EMBODIMENTS

Figure 1:
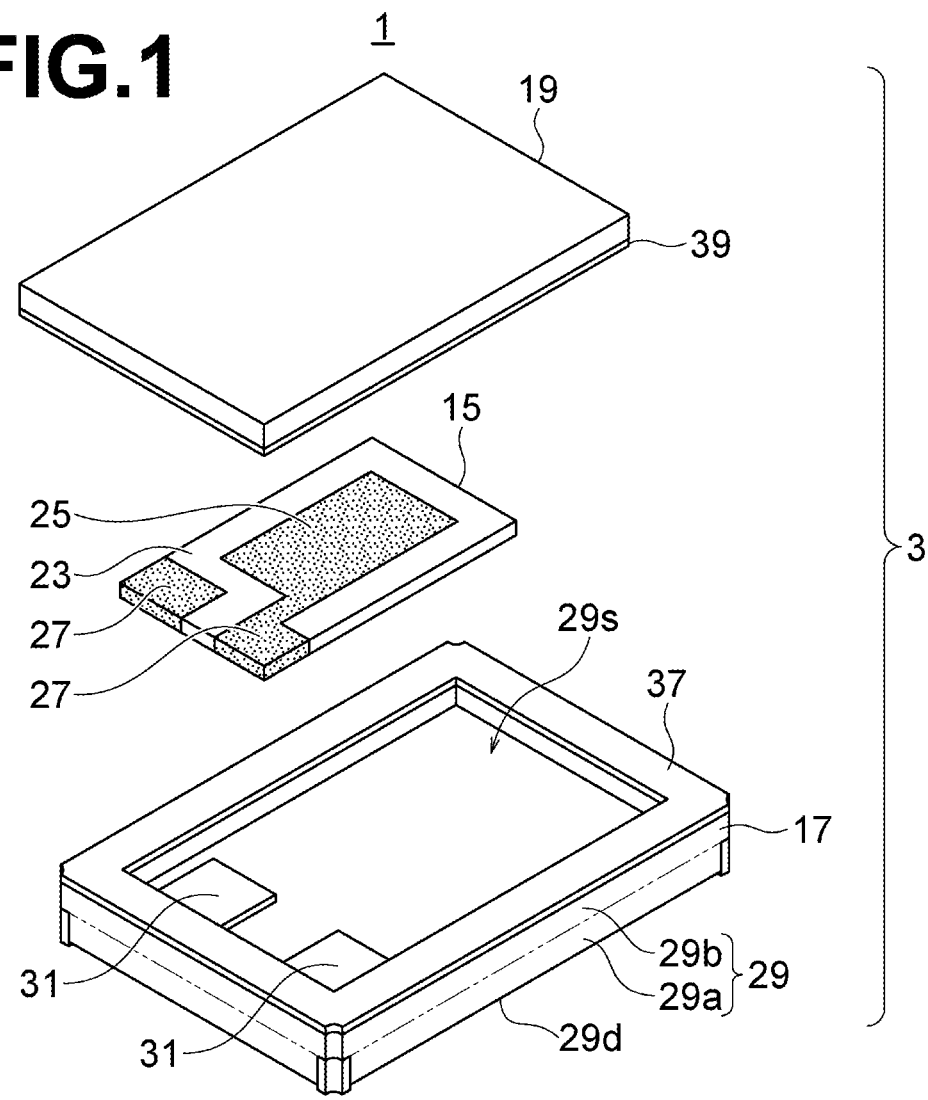
FIG. 1 is a disassembled perspective view showing a schematic configuration of a crystal device according to an embodiment.
Figure 1:
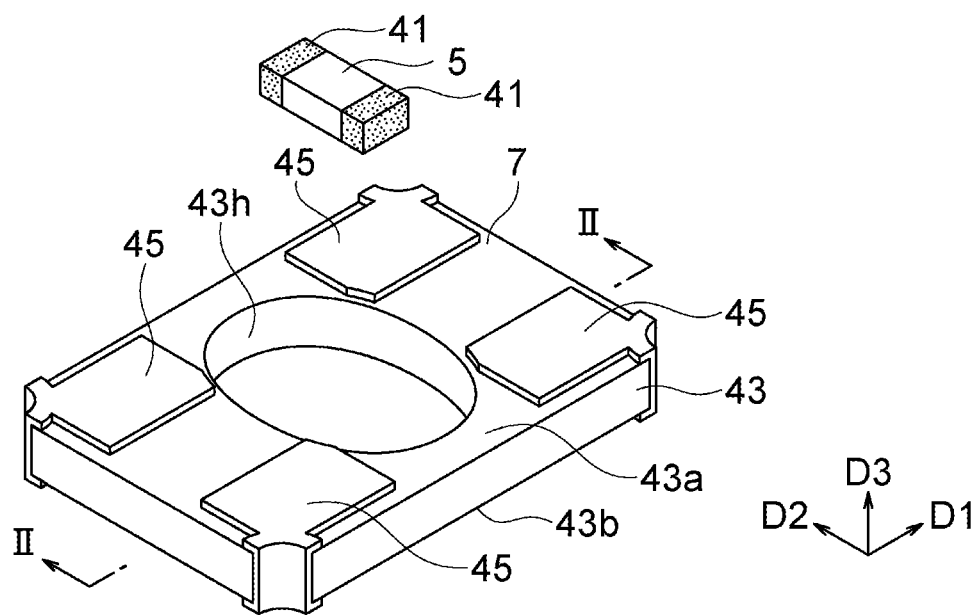

Below, an embodiment of the present disclosure will be explained with reference to the drawings. Note that, the drawings used in the following explanation are schematic ones. Size ratios etc. do not always coincide with the actual ones. Further, in the drawings, for the purpose of making mutual relationships of the drawings clear, for convenience, sometimes an orthogonal coordinate system comprised of a D1 axis, D2 axis, and D3 axis will be attached. In the crystal device according to the embodiment, any direction may be defined as "above" or "below". Below, for convenience, sometimes the "upper surface" or "lower surface" and other terms will be used where the positive side of the D3 axis direction is the upper part. Further, for convenience, sometimes hatching will be attached to the top surface (that is, the surface which is not a cross-section) of the conductive layer or the like.

(Schematic Configuration of Crystal Device)

Figure 2:
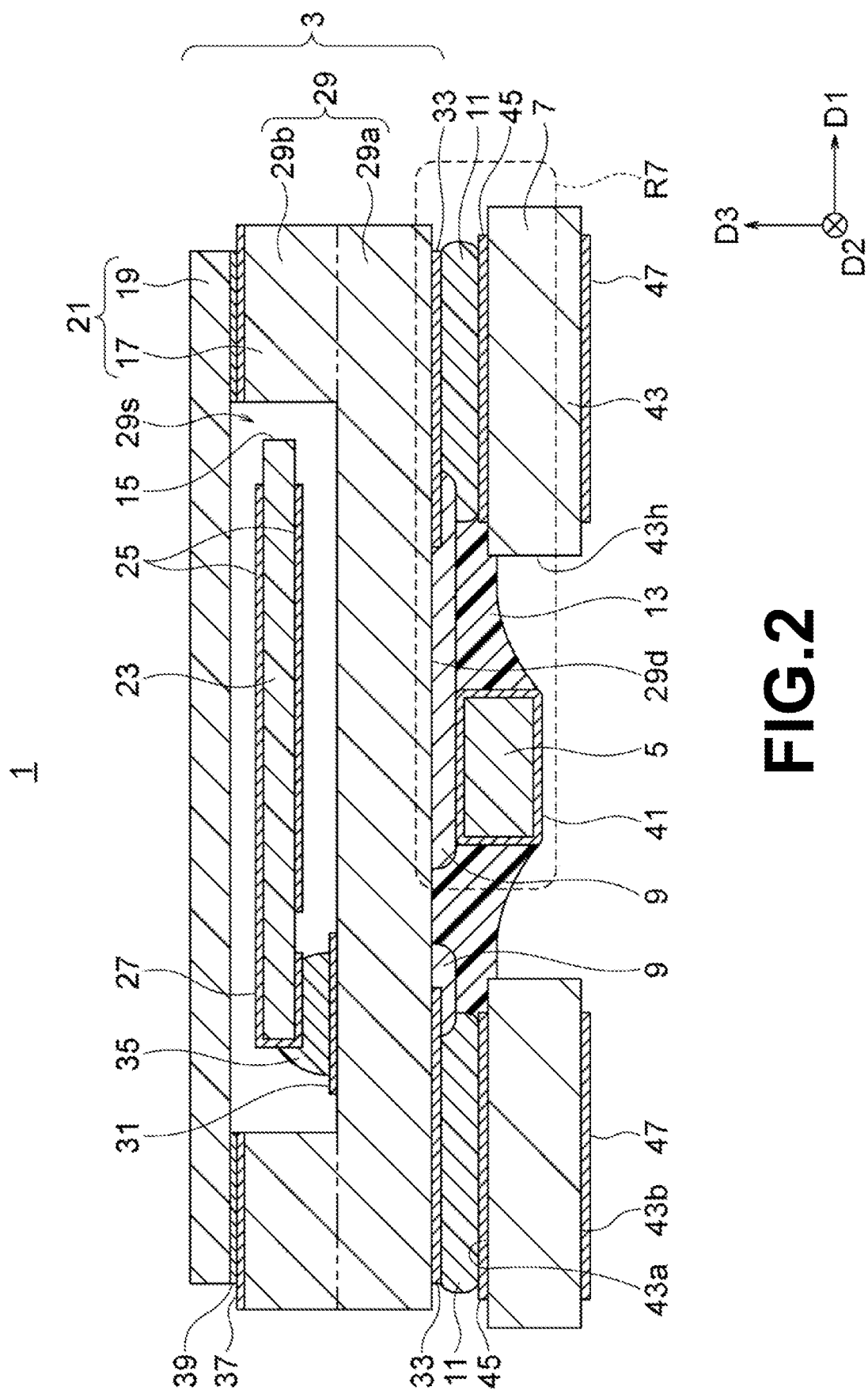
FIG. 2 is a cross-sectional view taken along the II-II line in FIG. 1.

FIG. 1 is a disassembled perspective view showing a schematic configuration of a crystal device 1 according to an embodiment of the present disclosure. FIG. 2 is a cross-sectional view taken along the II-II line in FIG. 1. Note that, in FIG. 2, for showing the configuration of the crystal device 1 more easily understandably, a cross-section at a position somewhat offset from the II-II line is also shown.

The crystal device 1 is configured as a crystal resonator (crystal unit) provided with a temperature sensitive element, generates vibration utilized for generation of an oscillation signal etc., and converts temperature to an electrical signal. This electrical signal is for example utilized for compensation of a change of the frequency characteristic of the crystal device 1 caused by a temperature change by an electronic circuit on the outside of the crystal device 1.

The crystal device 1 is for example made schematically a thin rectangular cuboid shape as a whole. The dimensions thereof may be suitably set. For example, in a relatively small one, the length of the long side (D1 direction) or short side (D2 direction) is 1 mm to 2 mm, and the thickness (D3 direction) is 0.5 mm to 0.8 mm.

The crystal device 1 for example has a crystal resonator 3 (hereinafter, "crystal" will be omitted), a temperature sensitive element 5 mounted in the resonator 3, and a circuit board 7 on which the resonator 3 is mounted. Further, as shown in FIG. 2, the crystal device 1 has conductive adhesives 9 utilized for mounting the temperature sensitive element 5 in the resonator 3 and the like, bonding materials 11 for mounting the resonator 3 on the circuit board 7, and an underfill 13 for sealing the temperature sensitive element 5.

The resonator 3, by application of AC voltage, generates a natural frequency in its internal portion. This natural frequency is utilized for generation of the oscillation signal etc. as described above. The temperature sensitive element 5 converts temperature to an electrical signal. The circuit board 7 mediates the electrical signal between an apparatus on outside of the crystal device 1 and the resonator 3 and temperature sensitive element 5. The specific configurations of them are for example as follows.

(Resonator)

The resonator 3 for example has a crystal element 15, a mounting member 17 which holds the crystal element 15, and a lid 19 which seals the mounting member 17. The mounting member 17 and lid 19 configure the package 21 of the resonator 3.

The crystal element 15 for example has a crystal blank 23 (piezoelectric blank), a pair of excitation electrodes 25 for supplying voltage to the crystal blank 23, and a pair of lead-out electrodes 27 for mounting the crystal element 15 in the mounting member 17.

The crystal blank 23 is for example formed in a schematically rectangular plate shape. The crystal blank 23 is for example configured by an AT-cut crystal blank. The pair of excitation electrodes 25 are for example provided in layer shapes on the center sides of the two major surfaces of the crystal blank 23. The pair of lead-out electrodes 27 are for example led out from the pair of excitation electrodes 25 and are provided at one end side portions in the long direction of the crystal blank 23. The pair of excitation electrodes 25 and pair of lead-out electrodes 27 are for example formed in rotation symmetrical shapes by 180° about a not shown center line extending in the long direction of the crystal blank 23 so that either of the two major surfaces of the crystal element 15 may be made the mounting side.

Although particularly not shown, the crystal element may be various known ones other than the example shown. For example, the crystal element may be a so-called tuning-fork type as well. Further, when the crystal element is one having an AT-cut crystal blank, it may be a so-called mesa type having a center portion made thicker or may be a so-called convex type which becomes thinner toward the outer edge. Further, the planar shape (shape of outer edge) of the AT-cut crystal blank may be a shape other than a rectangle such as an ellipse.

Note that, when referring to the crystal, electrodes, terminals, pads, etc. as "rectangular" or "quadrilateral" in the present disclosure, unless particularly explained otherwise, ones which may be schematically rectangular or quadrilateral are included. For example, a shape formed by chamfering corner portions by straight lines or curves in a rectangle or quadrilateral in a strict meaning is included in a rectangle or quadrilateral.

(Mounting Member)

The mounting member 17 for example has an insulating base body 29 and various conductors (for example metals) provided at the base body 29. The various conductors are for example a pair of mounting pads 31 for mounting the crystal element 15 in the mounting member 17, a plurality of (four in the present embodiment) mounting terminals 33 for mounting the resonator 3 on the circuit board 7, and not shown wiring conductors which connect the pair of mounting pads 31 and two among the four mounting terminals 33.

Note that, the mounting member 17 in the present embodiment does not have a pad for mounting the temperature sensitive element 5. However, the mounting member 17 may have such a pad as well.

The base body 29 is for example integrally formed by ceramic. Its shape is a box shape having a recessed part (space 29s) holding the crystal element 15. The base body 29 for example has a flat plate-shaped substrate part 29a and a frame 29b superposed on the substrate part 29a. The recessed part is configured by these.

The pair of mounting pads 31 are for example provided in layer shapes on the bottom surface of the recessed part in the base body 29 (the major surface on the space 29s side in the substrate part 29a). Further, the pair of mounting pads 31 are for example aligned along one short side among four sides of the bottom surface of the recessed part. The planar shapes and areas of the mounting pads 31 may be suitably set. In the example shown, the pair of mounting pads 31 are given mutually the same configurations. Further, the planar shape of each mounting pad 31 is rectangular shape having four sides which are parallel to the four sides of the substrate part 29a.

Figure 3:
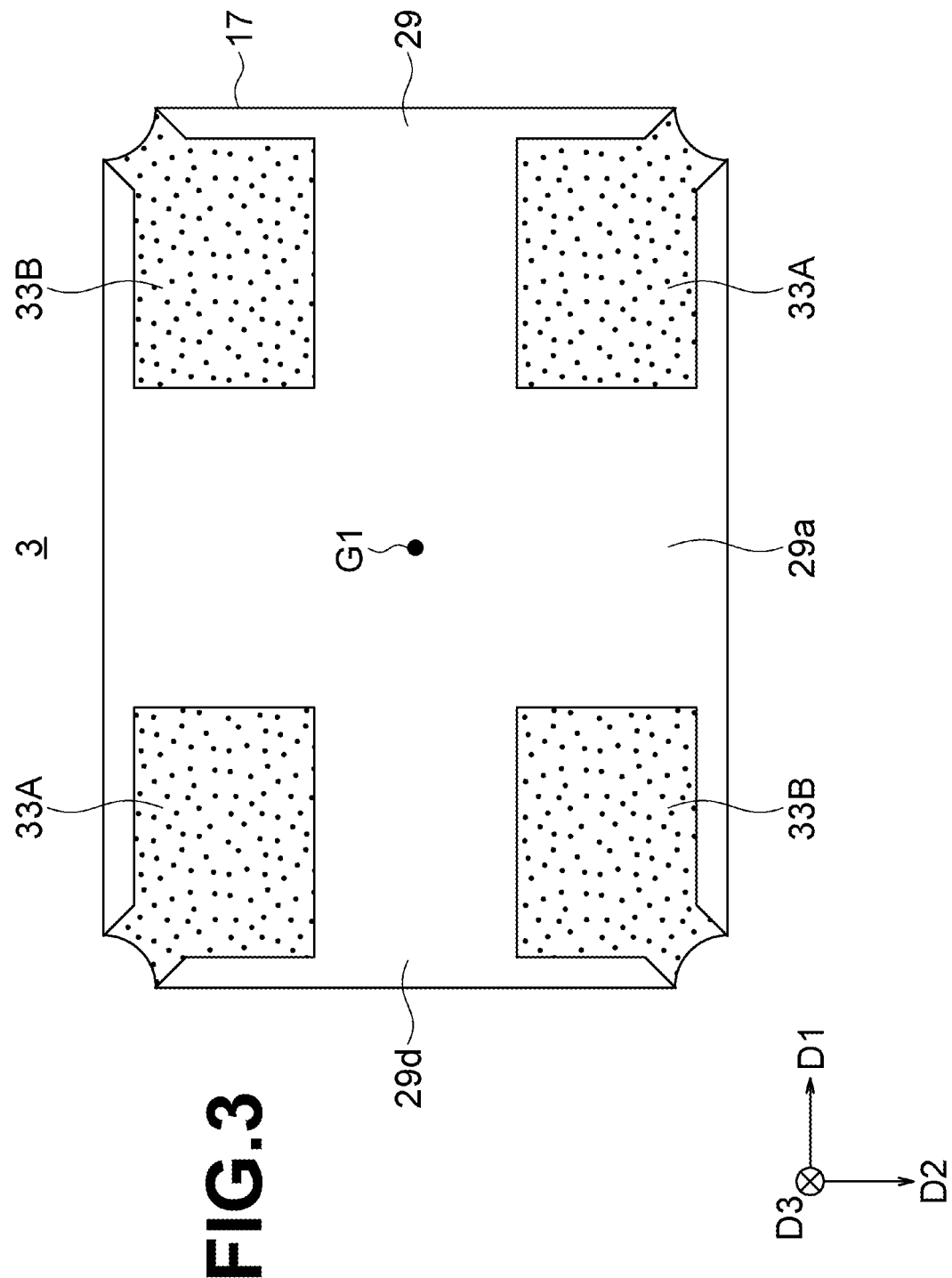
FIG. 3 is a bottom surface view of a resonator in the crystal device in FIG. 1.

The plurality of mounting terminals 33 are for example provided in layer shapes at the four corners of the major surface (lower surface 29d) on the opposite side to the space 29s in the substrate part 29a. The planar shapes and areas of the mounting terminals 33 may be suitably set. For example, as shown in FIG. 3 which will be explained later, the plurality of mounting terminals 33 (33A and 33B) are given the same configurations as each other. The planar shape of each mounting terminal 33 is schematically a rectangular shape having four sides parallel to the four sides of the circuit board 7. One among the mounting terminals 33 may have a cut away part for differentiating the orientation of the circuit board 7 as well.

Not shown wiring conductors connecting the mounting pads 31 and the mounting terminals 33 are for example configured by layered conductors formed on the major surface on the space 29s side in the substrate part 29a and via conductors penetrating through the substrate part 29a. The layered conductors may be provided in the internal portion of the substrate part 29a as well. Further, it is also possible to provide them on the major surface (lower surface 29d) of the substrate part 29a at the opposite side to the space 29s.

The crystal element 15 is fixed to the mounting member 17 in a cantilever manner by bonding of the pair of lead-out electrodes 27 and the pair of mounting pads 31 by a pair of bumps 35 (FIG. 2) and is electrically connected to the mounting member 17. Note that, the bumps 35 are for example made of a conductive adhesive comprised of a thermosetting resin in which a conductive filler is mixed.

The lid 19 is for example made of a metal. The lid 19 is bonded to the frame 29b of the mounting member 17. Due to this, the space 29s is sealed. The interior of the space 29s is for example evacuated or sealed with a suitable gas (for example nitrogen).

The lid 19 and the mounting member 17 may be bonded by a suitable method. For example, a frame-shaped first bonding-use pattern 37 made of a metal is formed on the surface of the frame 29b on the lid 19 side. On the other hand, a frame-shaped second bonding-use pattern 39 made of a metal is formed on the surface of the lid 19 on the frame 29b side. Further, the lid 19 and the mounting member 17 are bonded to each other by bonding the two by seam welding.

(Temperature Sensitive Element)

The temperature sensitive element 5 is for example configured by an element changing in electrical characteristics (for example resistance value) in accordance with a temperature change. As such an element, for example there can be mentioned a thermister, resistance temperature detector, and diode. The temperature sensitive element 5 is for example formed in a substantially rectangular cuboid shape and has a pair of element terminals 41 on its two ends. The element terminals 41 are at least exposed at the surfaces facing the substrate part 29a in the rectangular cuboid shape of the temperature sensitive element 5. In the example shown, the element terminals 41 are formed over five surfaces of the upper and lower surfaces, side surfaces, and end surface at each end part in the long direction of the rectangular cuboid.

(Circuit Board)

The circuit board 7 may be given for example the same configuration as a rigid type printed circuit board. For example, the circuit board 7 has an insulation substrate 43 and various types of conductors (for example metal) provided on the insulation substrate 43. The various types of conductors are for example a plurality of (four in the present embodiment) mounting pads 45 for mounting the resonator 3 on the circuit board 7, a plurality of (four in the present embodiment) external terminals 47 for mounting the circuit board 7 (crystal device 1) on a not shown circuit board, and wiring conductors (notation is omitted) which connect the plurality of mounting pads 45 and the plurality of external terminals 47. Note that, although not particularly shown, the circuit board 7 may have a solder resist which covers the insulation substrate 43 while exposing the external terminals 47 and mounting pads 45 as well.

The insulation substrate 43 is for example made of a glass epoxy material. In the insulation substrate 43 (circuit board 7), an opening 43h penetrating through this insulation substrate 43 from the upper surface 43a to the lower surface 43b is formed. In this opening 43h, the temperature sensitive element 5 (strictly speaking, a portion on the lower side of the temperature sensitive element 5) is held.

The planar shapes and sizes of the outer edge of the insulation substrate 43 and the opening 43h may be suitably set. In the example shown, the planar shape of the outer edge of the insulation substrate 43 is rectangular. The region formed by the outer edge of the insulation substrate 43 is for example made a size in which the resonator 3 fits when viewed on a plane. Further, in the example shown, the planar shape of the opening 43h is an elliptical shape (it need not to be an ellipse in terms of mathematics) having the short direction of the insulation substrate 43 as its long direction. Note that, the planar shape of the opening 43h, other than this, may be for example a circular shape, an elliptical shape having the long direction of the insulation substrate 43 as its long direction, or a rectangle having four sides parallel to the four sides of the insulation substrate 43 or another polygon.

The plurality of mounting pads 45 are for example provided in layer shapes at four corner sides of the upper surface of the insulation substrate 43 and surround the opening 43h. The plurality of external terminals 47 are for example provided in layer shapes at the four corners of the lower surface of the insulation substrate 43 and surround the opening 43h. The wiring conductors (notation omitted) connecting the plurality of mounting pads 45 and the plurality of external terminals 47 are for example configured by layered conductors positioned on the inner surface of the recessed part (castellation) formed at the four corners of the insulation substrate 43. In addition to or in place of such layer shaped conductors, the conductors may be configured by via conductors or through hole conductors vertically penetrating through the insulation substrate 43 and/or layer shaped conductors positioned on the inner circumferential surface of the opening 43h.

The planar shapes and areas of the mounting pads 45 and external terminals 47 may be suitably set. In the example shown, the plurality of mounting pads 45 are given mutually the same configurations. The planar shape of each mounting pad 45 is schematically a rectangle having four sides parallel to the four sides of the circuit board 7 where one corner portion is cut by a curve following along the opening 43h. Further, as shown in FIG. 6 which will be explained later, the plurality of external terminals 47 (47A and 47B) are for example given mutually the same configurations. The planar shape and size of each external terminal 47 is made schematically the same as the planar shape and size of the mounting pad 45. Note that, the planar shapes of the mounting pad 45 and external terminal 47 may be shapes not cut by the opening 43h as well. Further, one among the external terminals 47 may have a cut away part for differentiating the orientation of the crystal device 1 as well.

(Conductive Adhesives)

Figure 4:
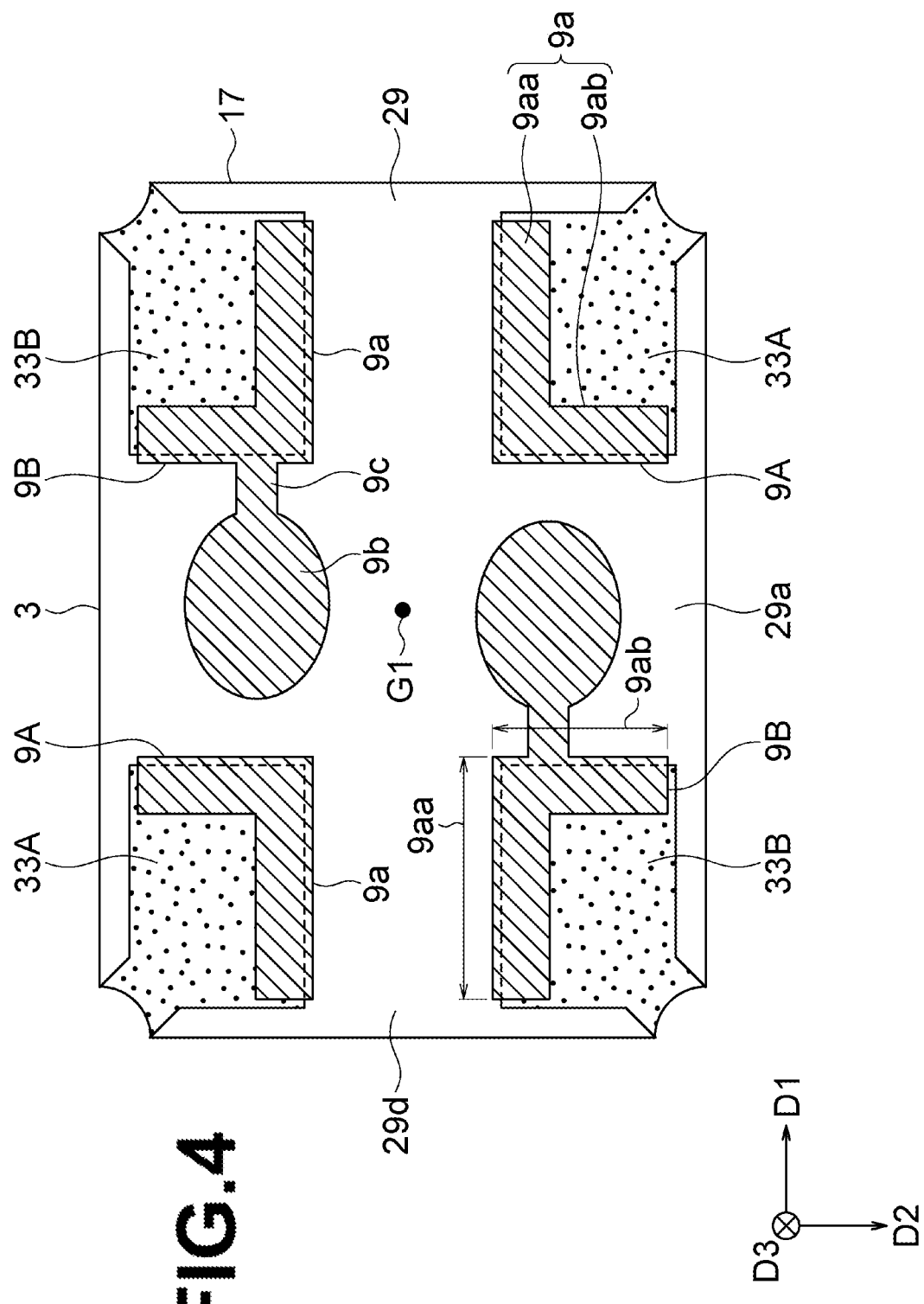
FIG. 4 is a bottom surface view of the resonator in FIG. 3 shown in a state where it is provided on a conductive adhesive.
Figure 5:
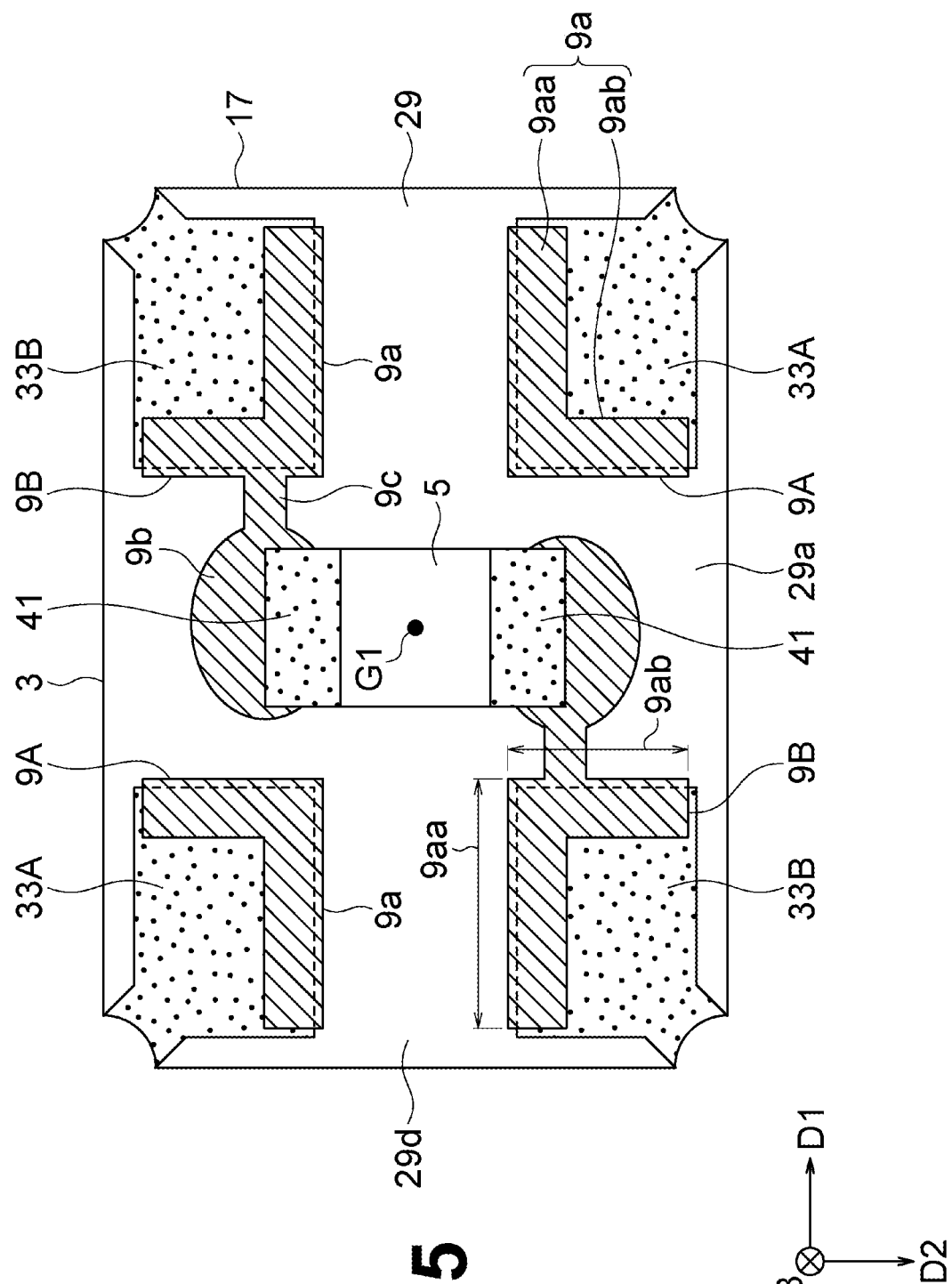
FIG. 5 is a bottom surface view of the resonator in FIG. 3 shown in a state where a temperature sensitive element is mounted.

FIG. 3 is a bottom surface view of the resonator 3 (from another viewpoint, the mounting member 17, base body 29, or substrate part 29a). FIG. 4 is a bottom surface view of the resonator 3 shown in a state where conductive adhesives 9 (9A and 9B) are provided. FIG. 5 is a bottom surface view of the resonator 3 shown in a state where the temperature sensitive element 5 is mounted. FIG. 6 is a bottom surface view of the crystal device 1. Further, FIG. 7 is a cross-sectional view corresponding to the VII-VII line in FIG. 6 and corresponds also to an enlarged view of a region R7 in FIG. 2.

As will be understood from a comparison of FIG. 3 and FIG. 4, on the lower surface of the mounting member 17, the conductive adhesives 9 (9B) extend from positions overlapping the mounting terminals 33 (33B) of the mounting member 17 to the outer sides of the mounting terminals 33 and are directly superposed on the lower surface 29d of the base body 29 in the mounting member 17. Further, as will be understood from FIG. 5 to FIG. 7, the element terminals 41 of the temperature sensitive element 5 are bonded to the portions in the conductive adhesives 9 which are directly superposed on the lower surface 29d. Specifically, this is as follows.

As shown in FIG. 3 etc., the four mounting terminals 33 in the resonator 3 have a pair of first mounting terminals 33A and a pair of second mounting terminals 33B.

In the resonator 3, the pair of first mounting terminals 33A are electrically connected to the pair of mounting pads 31 (from another viewpoint, the crystal element 15 mounted on the pair of mounting pads 31). Further, the first mounting terminals 33A contribute to electrical connection of the crystal element 15 with a circuit member (here, circuit board 7) outside of the resonator 3. On the other hand, the pair of second mounting terminals 33B are for example not particularly connected to elements etc. inside the resonator 3, but are independent. The pair of second mounting terminals 33B contribute to electrical connection of the temperature sensitive element 5 with a circuit member (here, circuit board 7) which is different from the resonator 3.

Note that, according to the configuration of the crystal device 1, a reference potential may be given to one of the pair of first mounting terminals 33A and/or one of the pair of second mounting terminals 33B. The mounting terminal 33 given the reference potential may be connected to suitable conductors in the resonator 3. For example, when the lid 19 is made of metal, the mounting terminal 33 may be connected to this lid 19. Further, when a shield is provided on the resonator 3, the mounting terminal 33 may be connected to the shield. Further, the first mounting terminal 33A given the reference potential and the second mounting terminal 33B given the reference potential may be connected as well.

In a case where the pair of first mounting terminals 33A and the pair of second mounting terminals 33B are distributed to the four corners of the lower surface 29d of the resonator 3, to which of the four corners each terminal is positioned at may be suitably set. In the example shown, the pair of first mounting terminals 33A are positioned at a pair of opposite angles, and the pair of second mounting terminals 33B are positioned at another pair of opposite angles.

However, the two of the pair of first mounting terminals 33A (or two of the pair of second mounting terminals 33B) may be positioned on the two ends of one long side or positioned on the two ends of one short side.

As shown in FIG. 4, the conductive adhesives 9 arranged at the plurality of positions include first conductive adhesives 9A which are bonded to the first mounting terminals 33A and second conductive adhesives 9B which are bonded to the second mounting terminals 33B. The second conductive adhesives 9B contribute to mounting of the temperature sensitive element 5 onto the resonator 3 as described above. The first conductive adhesives 9A may be omitted. However, by provision, they exert various effects which will be explained later.

The conductive adhesives 9, as schematically shown at the top left of the drawing sheet in FIG. 7, are configured by a thermosetting resin 9e containing a conductive filler 9f. The material, particle size, and filling ratio of the conductive filler and the material etc. of the thermosetting resin may be various known ones. Further, the material for the conductive adhesives 9 may be the same as the material for the bumps 35 for mounting the crystal element 15 in the mounting member 17 or may be different from the latter.

The conductive adhesives 9 may be made substantially uniform thicknesses over a plurality of portions explained later or may be made thicknesses different according to the portions. In the explanation of the present embodiment, a case where the thicknesses are substantially uniform will be taken as an example. The specific values of the thicknesses of the conductive adhesives 9 may be suitably set.

As shown in FIG. 4 and FIG. 5, the first conductive adhesives 9A and second conductive adhesives 9B have terminal corresponding parts 9a which are superposed on the mounting terminals 33. The second conductive adhesives 9B further have element corresponding parts 9b bonded to the temperature sensitive element 5 (element terminal 41) and have wiring parts 9c connecting the element corresponding parts 9b and the terminal corresponding parts 9a.

Each terminal corresponding part 9a for example follows along at least part of the outer edge of a mounting terminal 33. In the example shown, the terminal corresponding part 9a follows along portions (two sides) in the outer edge (among the four sides) of the mounting terminal 33 which face the other mounting terminals 33. In more detail, in the present embodiment, the mounting terminals 33 are provided at the four corners of the rectangular lower surface 29d of the resonator 3. Each mounting terminal 33 has four sides parallel to the four sides of the lower surface 29d. Further, the terminal corresponding part 9a has a first outer edge corresponding portion 9aa following along one side among the four sides of the mounting terminal 33 which becomes the center side in the short direction of the lower surface 29d and a second outer edge corresponding portion 9ab along one side which becomes the center side in the long direction of the lower surface 29d.

The first outer edge corresponding portion 9aa and the second outer edge corresponding portion 9ab for example extend over substantially the entire lengths (for example 90% or more) of the sides of the mounting terminal 33. One side of the mounting terminal 33 and the end part (short side) in the long direction of the outer edge corresponding portion which follows along this one side may coincide, or either of the two may extend further outward from the other. Further, one side of the mounting terminal 33 and the side surface (long side) of the outer edge corresponding portion along this one side may coincide, or either of the two may be offset to the outer side.

The outer edge corresponding portions (9aa and 9ab) may extend with constant widths as in the example shown or may extend while changing in widths. Specific values of the widths of the outer edge corresponding portions may be suitably set. For example, the width of the outer edge corresponding portion may be made 1/20 or more, 1/10 or more, 1/5 or more, or 1/3 or more of the minimum diameter (length of the short side) of the mounting terminal 33. Further, it may be made 1/2 or less, 1/3 or less, 1/5 or less, or 1/10 or less. The lower limit and the upper limit described above may be suitably combined so far as they are not contradictory.

When referring to "the outer edge corresponding portion following along the side of the mounting terminal 33", the outer edge corresponding portion need not to have a shape (long shape) having a sufficient length (length parallel to the side of the mounting terminal 33) relative to the width (length of the direction perpendicular to the side of the mounting terminal 33). For example, the outer edge corresponding portion may be close to a square or circle. Naturally, the outer edge corresponding portion may be long shaped. For example, in the outer edge corresponding portion, the length may be made 1.5 times or more, 2 times or more, or 5 times or more of the width.

The position, shape, and size of each element corresponding part 9b when viewed on a plane may be suitable ones so far as at least a portion of the element corresponding part 9b is superposed on at least a portion of the element terminal 41 in the temperature sensitive element 5. For example, the direction of arrangement of the pair of element corresponding parts 9b may be the short direction of the lower surface 29d of the resonator 3 (example shown), may be the long direction of the lower surface 29d, or another direction. Further, for example, the planar shape of each element corresponding part 9b may be an elliptical shape (example shown), circular, or polygonal (for example rectangular). The area of each element corresponding part 9b may be smaller than, equal to, or larger than the area of the element terminal 41 when viewed on a plane.

The position, shape, and size of each wiring part 9c may be suitably set. In the example shown, each wiring part 9c is provided by a route connecting an element corresponding part 9b and a terminal corresponding part 9a with the shortest distance. From another viewpoint, the wiring part 9c is straight in its entirety. Further, the element corresponding part 9b (at least a portion of that) is positioned between the mounting terminals 33 which are positioned on the two sides of the long direction of the lower surface 29d of the resonator 3, and the wiring parts 9c extend parallel to the long direction described above. Note that, each wiring part 9c, unlike the illustration, may have a portion bent in an L-shape or may linearly extend in the short direction or diagonal direction of the lower surface 29d. The wiring parts 9c may extend with constant widths or may extend while changing in widths. Further, the width of the wiring part 9c may be different from the width of the terminal corresponding part 9a and/or element corresponding part 9b or may be the same as the latter. In the example shown, the element corresponding part 9b is expanded in width relative to the width (D2 direction) of the wiring part 9c and thereby becomes a pad shape.

In the present embodiment, the terminal corresponding parts 9a, element corresponding parts 9b, and wiring parts 9c are shaped so that they can be differentiated from each other. However, they need not have planar shapes which can be differentiated from each other. For example, the element corresponding parts 9b and the wiring parts 9c may be given mutually the same widths (lengths in the D2 direction in the example shown) and connected in series, therefore the boundary of the two need not be able to be differentiated from their planar shapes. Note that, even in this case, the parts in the second conductive adhesive 9B may be classified by making the portions bonded to the element terminals 41 the element corresponding parts 9b, making the portions bonded to the mounting terminals 33 the terminal corresponding parts 9a, and making the portions connecting the two the wiring parts 9c. In the explanation of the present embodiment, for convenience, the terminal corresponding parts 9a, element corresponding parts 9b, and the wiring parts 9c are differentiated based on the planar shapes.

The pair of first conductive adhesives 9A are for example made mutually the same configurations (shapes, sizes, etc.) excluding the difference due to differences of the positions and orientations of the pair of first mounting terminals 33A. In the same way, the pair of second conductive adhesives 9B are for example made mutually the same configurations excluding the difference due to differences of the positions and orientations of the pair of second mounting terminals 33B.

In more detail, in the present embodiment, the pair of first conductive adhesives 9A are made mutually point symmetrical shapes (including positions and sizes) relative to the geometric center G1 (center) of the lower surface 29d of the resonator 3. In the same way, the pair of second conductive adhesives 9B are given mutually point symmetrical shapes (including positions and sizes) relative to the geometric center G1.

When described for confirmation, the "geometric center" is a point where the first moment of area relative to any axis passing through that point becomes 0. Further, the "point symmetry" referred to here may be for example a state where an area not less than a predetermined ratio of one conductive adhesive 9 and an area not less than a predetermined ratio of another conductive adhesive 9 overlap at the time of rotation by 180°. The predetermined ratio described before may be 80%, 90%, or 95%. The same is true for the other point symmetry explained in the present disclosure.

Note that, unlike the example shown, the pair of first conductive adhesives 9A and/or the pair of second conductive adhesives 9B may not have point symmetrical shapes about the geometric center G1. For example, the pair of first conductive adhesives 9A (or the pair of second conductive adhesives 9B) may have mutually point symmetrical shapes about a symmetrical point which is different from the geometric center G, may have mutually linear symmetrical shapes relative to a center line or the like (parallel to the short direction or long direction of the lower surface 29d) of the lower surface 29d of the resonator 3, or may not have such symmetry.

As shown in FIG. 6, in the present embodiment, the geometric center G1 of the lower surface 29d of the resonator 3 coincides with the geometric center of the circuit board 7, the geometric center of the opening 43h of the circuit board 7, and the geometric center of the temperature sensitive element 5. Further, although not particularly shown, it coincides with also the geometric center of the crystal element 15. The state where the geometric centers coincide referred to here may be for example a state where mutual deviation of the geometric centers is less than 20%, less than 10%, or less than 5% of the length of the short side of the lower surface 29d.

The geometric centers coincide as described above, therefore the pair of second conductive adhesives 9B which have mutually point symmetrical shapes about the geometric center G1 of the lower surface 29d of the resonator 3 have point symmetrical shapes about the geometric center of the opening 43h in the region overlapping the opening 43h. Note that, in the following description, sometimes the geometric center G1 will be referred to as the "geometric center of the opening 43h".

The region in the conductive adhesive 9 which overlaps the opening 43h may be made a suitable range. In the example shown, in the conductive adhesive 9, the entirety of the element corresponding part 9b, the substantial entirety of the wiring part 9c (for example 90% or more), and a portion of the terminal corresponding part 9a overlap the opening 43h. Naturally, unlike the example shown, a portion of the element corresponding part 9b need not overlap the opening 43h, the entirety of the wiring part 9c may overlap the opening 43h, substantially the entirety of the wiring part 9c (for example 90% or more) or entirety need not overlap the opening 43h or a relatively broad range of the terminal corresponding part 9a (for example ½ or more of the area of the terminal corresponding part 9a) may overlap the opening 43h.

(Bonding Material)

The bonding materials 11 shown in FIG. 2 and FIG. 7 which connect the mounting terminals 33 in the resonator 3 and the mounting pads 45 on the circuit board 7 is made of metal. For example, the bonding material 11 may be solder. The solder may be so-called solder in a narrow sense (Pb—Sn alloy) or may be so-called lead-free solder. As the lead-free solder, there can be mentioned an Sn—Ag—Cu-based, Sn—Zn—Bi-based, Sn—Cu-based, Sn—Ag—In—Bi-based, or other various alloys. Further, the bonding material 11 may be configured by a pure metal as well. The bonding material 11 may contain an ingredient other than a metal, for example, a flux. When referred to in comparison with the conductive adhesive, the bonding material 11 made of metal is one not having a matrix material made of resin, but is formed by mutual connection of metals with themselves.

The bonding materials 11 are bonded to the mounting terminals 33 and mounting pads 45. Further, the bonding materials 11 are bonded to at least parts in the parts (terminal corresponding parts 9a) overlapping the mounting terminals 33 in the conductive adhesive 9. That is, the mounting terminal 33 and the mounting pad 45, in parts in mutually facing regions, are bonded by only the bonding material 11, while are bonded by the conductive adhesive 9 and bonding material 11 interposed in order in the facing direction of the two in the other parts.

The area of overlap of the bonding material 11 and the terminal corresponding part 9a of the conductive adhesive 9 may be suitably set. For example, the bonding material 11 may overlap the entirety of the terminal corresponding part 9a or may overlap a portion. Further, the area of overlap of the bonding material 11 and the terminal corresponding part 9a on the mounting terminal 33 may be made ¹⁄₂₀ or more, ¹⁄₁₀ or more, ⅕ or more, ⅓ or more, ½ or more, or ¾ or more relative to the area of the mounting terminal 33 (or area of projection of the bonding material 11 onto the mounting terminal 33). Further, it may be made 1 time or less, ¾ or less, ½ or less, ⅓ or less or ⅕ or less, or ¹⁄₁₀ or less. The lower limit and upper limit described before may be suitably combined unless they are contradictory.

Further, the thickness of the conductive adhesive 9 relative to the thickness of the bonding material 11 (maximum thickness, distance between the mounting terminal 33 and the mounting pad 45) may be suitably set. For example, the thickness of the conductive adhesive 9 may be made ¹⁄₂₀ or more, 1/10 or more, 1/5 or more, 1/3 or more, or 1/2 or more of the thickness of the bonding material 11. Further, the former may be made 3/4 or less, 1/2 or less, 1/3 or less, or 1/5 or less of the later. The lower limit and upper limit described before may be suitably combined unless they are contradictory.

The area of direct bonding of the bonding material 11 with respect to the mounting terminal 33 and indirect bonding through the conductive adhesive 9 (substantially the area of projection of the bonding material 11 onto the mounting terminal 33) may be suitably set. For example, this area is substantially equal (for example 90% or more) relative to the area of the mounting terminal 33. However, the direct and indirect bonding areas of the bonding material 11 with respect to the mounting terminal 33 may be made relatively small as well. For example, this area may be made 70% or less or 50% or less of the area of the mounting terminal 33. In this case, the overlap of the bonding material 11 with respect to the conductive adhesive 9 may be made relatively small. In the same way, the bonding area of the bonding material 11 with respect to the mounting pad 45 may be made substantially equal (for example 90% or more) relative to the area of the mounting pad 45 or may be made relatively small (for example 70% or less or 50% or less).

(Underfill)

The underfill 13 is for example made of a thermosetting resin (for example an epoxy resin). The underfill 13 may contain a filler as well. As the filler, for example there can be mentioned one having a low thermal expansion coefficient compared with a resin (for example $SiO_2$). Other than this, for example, a filler having a lower or higher thermal conductivity compared with a resin may be added for adjustment of the thermal conductivity as well.

The underfill 13 is filled between the lower surface 29d of the resonator 3 and the temperature sensitive element 5, and is adhered to them. The underfill 13 is adhered also to at least single portions of the parts in the second conductive adhesives 9B and the element terminals 41 which are not bonded to each other. The underfill 13 may be provided so as to cover the side surfaces of the temperature sensitive element 5 up to a suitable height or may be provided so as to cover not only the side surfaces of the temperature sensitive element 5, but also the top surface (surface on −D3 side) of the temperature sensitive element 5.

In the underfill 13, for example, the part expanding to the periphery of the temperature sensitive element 5 reaches the inner circumferential surface of the opening 43h, is interposed between the resonator 3 and the circuit board 7 in at least the vicinity of this inner circumferential surface, and is adhered to them. Further, such adhesion is for example carried out over the entire circumference of the opening 43h. Accordingly, the opening 43h does not communication with the external portion (outside of the outer edges of the resonator 3 and circuit board 7) through a clearance between the resonator 3 and the circuit board 7. However, the underfill 13 may be arranged in a manner where the opening 43h communicating with the external portion through the clearance between the resonator 3 and the circuit board 7 as well.

(Method for Manufacturing Crystal Device)

The method for manufacturing the crystal device 1 may be basically made the same as known various known methods. However, in the method for manufacturing the crystal device 1, unlike the known method, a step of providing the conductive adhesives 9 on the lower surface 29d of the resonator 3, a step of arranging the temperature sensitive element 5 on the conductive adhesives 9 provided on the lower surface 29d, and a step of heating the conductive adhesives 9 to cure them are carried out.

A timing of the step of providing the conductive adhesives 9 on the lower surface 29d of the resonator 3 is for example after preparation of the mounting member 17 and before bonding of the mounting member 17 and the circuit board 7 by the bonding materials 11. Accordingly, this timing may be before or after provision of the bumps 35, may be before or after mounting of the crystal element 15, or may be before or after sealing of the space 29s by the lid 19.

The timing of the step of arranging the temperature sensitive element 5 on the conductive adhesives 9 is after the step of providing the conductive adhesives 9 described above. Accordingly, for example, the timing of the step of arranging the temperature sensitive element 5 may be made the same as the various timings of the step of providing the conductive adhesives 9 listed above. Note that, the timing of the step of arranging the temperature sensitive element 5 need not to be immediately after the timing of the step of providing the conductive adhesives 9. The other steps may be carried out between the two steps as well. However, a step where the conductive adhesives 9 end up curing before arrangement of the temperature sensitive element 5 on the conductive adhesives 9 (for example the step of curing the bumps 35 made of conductive adhesive) is not performed after providing the conductive adhesives 9. According to a specific aspect of the step of bonding the mounting member 17 and the circuit board 7 by the bonding materials 11, it is also possible to perform the step of arranging the temperature sensitive element 5 on the conductive adhesives 9 through the opening 43h in the circuit board 7 after the former step.

The timing of the step of curing the conductive adhesives 9 on which the temperature sensitive element 5 is arranged is after the step of arranging the above temperature sensitive element 5 on the conductive adhesives 9. Accordingly, for example, the timing of the step of curing the conductive adhesives 9 may be made the same as various timings of the step of providing the temperature sensitive element 5 listed above. Note that, the timing of the step of curing the conductive adhesives 9 need not to be immediately after the timing of the step of arranging the temperature sensitive element 5 on the conductive adhesives 9. Another step may be carried out between the two steps as well. Further, the step of curing the conductive adhesives 9, so as not to cure the bumps 35 before arrangement of the crystal element 15 on the bumps 35 after providing the bumps 35 made of the conductive adhesives, is carried out before or after the two steps. It is also possible to simultaneously perform curing of the bumps 35 and curing of the conductive adhesives 9 in theory.

Note that, for example, unlike the present embodiment, in a case where the entireties of the conductive adhesives 9 overlap the opening 43h, it is also possible to mount the temperature sensitive element 5 by providing the conductive adhesives 9 on the lower surface 29d of the resonator 3 through the opening 43h after bonding the resonator 3 and the circuit board 7 by the bonding materials 11.

As the method of providing the conductive adhesives 9 on the lower surface 29d of the resonator 3, for example there can be mentioned screen printing or another printing method. Further, other than this, the conductive adhesives 9 may be dispensed from a dispenser while making the dispenser relatively move relative to the lower surface 29d. The method for arranging the temperature sensitive element 5 may be the same as the conventional method. Further, also the method of curing the conductive adhesives 9 may be made one copying the curing method of the bumps 35.

As described above, in the present embodiment, the crystal device 1 has the crystal element 15, package 21 (mounting member 17), temperature sensitive component (temperature sensitive element 5), and conductive adhesives 9 (second conductive adhesives 9B). The package 21 has the insulating base body 29 and the connection conductors (second mounting terminals 33B). The base body 29 configures the sealed space 29s holding the crystal element 15. The second mounting terminals 33B are positioned on a predetermined surface (lower surface 29d) of the base body 29 which becomes the outer side with respect to the space 29s. The temperature sensitive element 5 has the part terminals (element terminals 41). The second conductive adhesive 9B is configured by the thermosetting resin 9e containing the conductive filler 9f and is bonded to the second mounting terminal 33B and element terminal 41.

Here, the crystal element 15 is held in the sealed space 29s, while the temperature sensitive element 5 is positioned at the external portion of the space 29s. Accordingly, for example, the change of temperature of atmosphere on the periphery of the crystal device 1 is not transferred much at all to the crystal element 15, but is easily transferred to the temperature sensitive element 5, and/or for example the temperature sensitive element 5 is mounted on the lower surface 29d of the substrate part 29a in the mounting member 17. The crystal element 15 is mounted on the upper surface of the substrate part 29a. The lower surface 29d faces a not shown circuit board on which the crystal device 1 is mounted, therefore the temperature sensitive element 5 is closer to the circuit board than the crystal element 15. Accordingly, for example, at the time when heat of the other devices mounted on the circuit board is transferred to the crystal device 1 through the circuit board and the external terminal 47 and/or the atmosphere above the circuit board, not much of this heat is transferred to the crystal element 15, but the heat is easily transferred to the temperature sensitive element 5. By heat being easily transferred to the temperature sensitive element 5 in this way, for example, sometimes a hypersensitive reaction arises in the detection temperature of the temperature sensitive element 5 compared with the temperature change of the crystal element 15. In this case, for example, precision of temperature compensation of the frequency characteristic of the crystal element 15 based on the detection temperature of the temperature sensitive element 5 falls.

On the other hand, in contrast to the conventional case where the temperature sensitive element was mounted by solder made of a metal, in the present embodiment, the temperature sensitive element 5 is mounted by the conductive adhesives 9. The conductive adhesives 9 are lower in thermal conductivity compared with solder. Accordingly, for example, the heat which is transferred from the atmosphere around the crystal device 1 or the circuit board on which the crystal device 1 is mounted through the materials for mounting the temperature sensitive element 5 (conductive adhesives 9 in the present embodiment) to the temperature sensitive element 5 can be reduced. As a result, a probability of discrepancy between the temperature of the crystal element 15 and the detection temperature of the temperature sensitive element 5 when the temperature changes on the periphery of the crystal device 1 can be lowered.

Further, for example, the conductive adhesives 9 are easier to elastically deform compared with solder, therefore are resistant to cracking. As a result, the probability of fall of the detection sensitivity of the temperature sensitive element 5 due to a crack can be lowered.

Further, in the present embodiment, in a plan view of a predetermined surface (lower surface 29d of the resonator 3), the part terminal (element terminal 41 of the temperature sensitive element 5) and the connection conductor (second mounting terminal 33B) are separated from each other. The conductive adhesives 9 (second conductive adhesives 9B) include the element corresponding parts 9b bonded to the element terminals 42 and the wiring parts 9c connecting the element corresponding parts 9b and the second mounting terminals 33B. The element corresponding parts 9b and the wiring parts 9c directly contact the insulating lower surface 29d.

That is, the crystal device 1 (resonator 3), on the lower surface 29d, has neither a pad (metal layer) which faces the element terminal 41 for mounting the temperature sensitive element 5 nor a wiring pattern (metal layer) extending from the pad to the second mounting terminal 33B. In this case, for example, the same effect as the effect concerning the heat transfer explained from comparison of the conductive adhesive 9 and solder as described above is exerted. Specifically, the conductive adhesive 9 is lower in thermal conductivity compared with a wiring pattern made of metal. Therefore, when the temperature of the external portion of the crystal device 1 changes, not much of that temperature is transferred to the temperature sensitive element 5. As a result, the probability of discrepancy of the temperature of the temperature sensitive element 5 and the temperature of the crystal element 15 is lowered.

Further, consider an aspect where pads facing the element terminals 41 of the temperature sensitive element 5 are provided on the lower surface 29d of the resonator 3 and these pads and the element terminals 41 are bonded by the conductive adhesives 9 (this aspect is also included in the art according to the present disclosure). Compared with this aspect, in the present embodiment, the temperature sensitive element 5 can be made closer to the lower surface 29d by the amount of removal of the pads. As a result, for example, this is advantageous for lowering the height of the crystal device 1. Further, from another viewpoint, the temperature sensitive element 5 can be separated from a not shown circuit board on which the crystal device 1 is mounted. Accordingly, for example, although according to the mode of the temperature change on the periphery of the crystal device 1 and/or mode of heat transfer to the internal portion of the crystal device 1, the heat transfer from the circuit board to the temperature sensitive element 5 can be delayed. As a result, the probability of discrepancy of the temperature of the temperature sensitive element 5 and the temperature of the crystal element 15 can be lowered.

Further, in the present embodiment, the crystal device 1 has the underfill 13 filled between the predetermined surface (lower surface 29d of the resonator 3) and the temperature sensitive component (temperature sensitive element 5).

In this case, for example, at least a part of the temperature sensitive element 5 can be insulated from the surrounding atmosphere to prolong the time until the temperature of the temperature sensitive element 5 reaches the temperature of the atmosphere on the periphery of the same. Accordingly, it is possible to lower the probability of discrepancy of the temperature of the temperature sensitive element 5 and the temperature of the crystal element 15 when the temperature on the periphery of the crystal device 1 changes.

Further, in the present embodiment, the crystal device 1 has the circuit board 7. The circuit board 7 has a first surface (upper surface 43a), second surface (lower surface 43b), opening 43*h*, mounting pads 45, and external terminals 47. The upper surface 43*a* faces the predetermined surface (lower surface 29*d* of the resonator 3). The lower surface 43*b* is the back surface of the upper surface 43*a*. The opening 43*h* penetrates from the upper surface 43*a* to the lower surface 43*b* and holds the temperature sensitive component (temperature sensitive element 5, at least a portion of that). The mounting pads 45 are positioned on the upper surface 43*a*, face the connection conductors (second mounting terminals 33B), and are bonded to them through the conductive bonding materials 11. The external terminals 47 are positioned on the lower surface 43*b* and are electrically connected with the mounting pads 45.

In this case, for example, by the combination of the package 21 for the resonator 3 and the circuit board 7, a package resembling a so-called H-shaped package can be realized. Here, for example, consider an aspect using as the resonator to be combined with the circuit board 7 a resonator provided with wirings and pads (conductor layers) for mounting the temperature sensitive element 5 on the lower surface 29*d* (this aspect also included in the art according to the present disclosure). The package for this resonator is provided with the wirings and pads for the temperature sensitive element 5, therefore becomes different from the package for the resonator not having a temperature sensitive element (one distributed alone as a resonator not combined with the circuit board 7). As a result, for example the manufacturing process of the package is no longer common between a resonator combined with the circuit board 7 and a resonator which does not have a temperature sensitive element. However, in a case where the wirings and pads for connecting the connection conductors (second mounting terminals 33B) and the temperature sensitive element 5 are substituted with the conductive adhesives 9, on a package for the resonator which does not have a temperature sensitive element, it is possible to provide the conductive adhesives 9 later and then mount the temperature sensitive element 5. That is, the manufacturing process of packages can be made common with each other. As a result, for example the manufacturing costs of the crystal device 1 can be reduced.

Further, for example, in such a pseudo H-shaped package, the temperature sensitive element 5 is positioned below the crystal element 15 (on the external terminal 47 side), so is arranged closer to the circuit board on which the crystal device 1 is mounted than the crystal element 15. In such an aspect, as already explained, by using the conductive adhesives 9, the effect of the probability of discrepancy of the temperature of the temperature sensitive element 5 and the temperature of the crystal element 15 being lowered takes effect.

Further, in the present embodiment, the temperature sensitive component (temperature sensitive element 5) has a pair of part terminals (element terminals 41). The package 21 for the resonator 3 has a pair of connection conductors (second mounting terminals 33B). Provision is made of a pair of conductive adhesives 9 (second conductive adhesives 9B) for individually connecting the pair of element terminals 41 and the pair of second mounting terminals 33B. The pair of second conductive adhesives 9B have mutually point symmetrical shapes relative to the geometric center G1 of the opening 43*h* of the circuit board 7 in the region where they overlap the opening 43*h*.

In this case, for example, the influences of heat received from the external portion of the crystal device 1 through the opening 43*h* can be made equal to each other between the second conductive adhesives 9B. Further, for example, at the time when the pair of second conductive adhesives 9B cure and contract or are deformed due to a temperature change in the external portion, bias of the deformation relative to the geometric center G1 can be reduced. As a result, for example, the positional deviation of the temperature sensitive element 5 relative to the opening 43*h* can be reduced. Further, usually the geometric center of the opening 43*h* substantially coincides with the geometric center of the substrate part 29*a* of the resonator 3. Accordingly, for example, by reducing the bias of deformation of the pair of second conductive adhesives 9B as described above, the bias of influence of the deformation exerted upon the substrate part 29*a* can be reduced. As a result, for example, the probability of occurrence of peculiar change in the frequency characteristics of the crystal element 15 due to the stress from the substrate part 29*a* can be lowered.

Further, in the present embodiment, the crystal device 1 has the bonding materials 11 made of metal which are bonded to the mounting pads 45 between the mounting pads 45 of the circuit board 7 and the connection conductors (second mounting terminals 33B) of the resonator 3. The conductive adhesives 9 (second conductive adhesives 9B) are interposed between at least single portions of the second mounting terminals 33B and the bonding materials 11 and are bonded to both.

In this case, for example, the reliability of the electrical conduction can be improved. Specifically, this is as follows. If shock is applied to the crystal device 1, there is a possibility that the bonding material 11 will peel off from the mounting terminal 33 and/or cracking will occur in the bonding material 11 from the position of contact with the mounting terminal 33 as the starting point. On the other hand, the conductive adhesive 9 can more easily elastically deform than the bonding material 11, so can absorb shock more than the bonding material 11, therefore the probability of peeling from the mounting terminal 33 or cracking caused from the position of contact with the mounting terminal 33 as the starting point is low. As a result, even if conduction failure arises due to peeling or cracking at the position where the bonding material 11 and the mounting terminal 33 are directly bonded, conduction is secured at the position where the bonding material 11 is bonded to the mounting terminal 33 through the conductive adhesive 9.

Further, for example, the area of contact of the bonding material 11 with the mounting terminal 33 can be reduced, therefore heat transferred from the circuit board 7 side to the mounting terminal 33 through the bonding material 11 can be reduced. As a result, for example, the probability of the temperatures of the temperature sensitive element 5 and resonator 3 tracking temperature change of the circuit board 7 oversensitively can be lowered.

Further, in the present embodiment, the crystal device 1 has the conductive bonding materials 11 which are bonded to the mounting pads 45 between the mounting pads 45 on the circuit board 7 and the connection conductors (second mounting terminals 33B) of the resonator 3. The conductive adhesives 9 (second conductive adhesives 9B) have the first parts (terminal corresponding parts 9*a*) which follow along at least parts of the edge parts of the second mounting terminals 33B in a plan view of the predetermined surface (lower surface 29*d* of the resonator 3). The bonding materials 11 are bonded to the second mounting terminals 33B at positions that become the inner sides of the second mounting terminals 33B relative to the terminal corresponding parts 9*a* in a plan view of the lower surface 29*d*.

In this case, for example, the conductive adhesives 9 can be utilized as dams for lowering the probability of outflow of the bonding materials 11 to the outside of the second mounting terminals 33B. As a result, for example, the probability of short-circuiting due to the outflow of the bonding materials 11 can be lowered. Further, for example, the conductive adhesives 9 easily insulate against heat of the mounting terminals 33 and bonding material 11. Accordingly, for example, as in the embodiment, by providing the conductive adhesives 9 along the portions in the outer edges of the mounting terminals 33 which become the temperature sensitive element 5 sides with respect to the bonding materials 11, the heat transferred from the mounting terminals 33 and bonding materials 11 to the temperature sensitive element 5 can be reduced.

Further, in the present embodiment, the package 21 for the resonator 3 has a plurality of mounting terminals 33 each including one or more connection conductors (second mounting terminals 33B) on the predetermined surface (lower surface 29*d* of the resonator 3). The first part (terminal corresponding part 9*a* of the conductive adhesive 9) follow along at least a part of the outer edge of the second mounting terminal 33B which located on a side of the mounting terminal 33 other than the second mounting terminal 33B.

In this case, for example, the probability of mutual short-circuiting of the mounting terminals 33 can be lowered. As a result, for example, it is possible to make the distance etc. between the mounting terminals 33 shorter to reduce the size of the circuit board 7 and/or make the areas of the mounting terminals 33 larger to improve the reliability of conduction.

Further, in the present embodiment, in each of all of the mounting terminals 33, either of the first part (terminal corresponding part 9*a*) of the conductive adhesive 9 (second conductive adhesive 9B) which is bonded to the part terminal (element terminal 41 of the temperature sensitive element 5) or the other conductive adhesive 9 (first conductive adhesive 9A) which is not bonded to the element terminal 41 is positioned along the part of the outer edge of the mounting terminal 33 becoming the other mounting terminal 33 side.

In this case, for example, the effect by providing the conductive adhesive 9 along the outer edge of the mounting terminal 33 as explained above is improved. The first conductive adhesive 9A is provided even at the first mounting terminal 33A not bonded to the element terminal 41 (for connecting the crystal element 15 and the circuit board 7). However, the first conductive adhesive 9A can be formed simultaneously with the formation of the second conductive adhesive 9B, therefore there is no increase of manufacturing process. That is, the step of providing the second conductive adhesives 9B for mounting the temperature sensitive element 5 on the resonator 3 can be effectively utilized also for the first mounting terminals 33A which are not directly concerned with the temperature sensitive element 5.

Note that, in the above embodiment, the crystal device 1 is one example of the piezoelectric device. The crystal element 15 is one example of the piezoelectric element. The lower surface 29*d* of the resonator 3 is one example of the predetermined surface. The second mounting terminal 33B is one example of the connection conductor. The temperature sensitive element 5 is one example of the temperature sensitive component. The element terminal 41 is one example of the part terminal. The upper surface 43*a* and lower surface 43*b* of the circuit board 7 are single examples of the first surface and second surface. The terminal corresponding part 9*a* of the second conductive adhesive 9B is one example of the first part. The second conductive adhesive 9B is one example of the conductive adhesive bonded to the element terminal, and the first conductive adhesive 9A is one example of the other conductive adhesive which is not bonded to the element terminal.

The art according to the present disclosure is not limited to the above embodiment and may be executed in various ways.

The piezoelectric element is not limited to a vibration element utilized in a resonator. For example, the piezoelectric element may be a SAW (surface acoustic wave) element or another acoustic wave element or may be a vibration element of a piezoelectric vibration type gyro sensor. From another viewpoint, the piezoelectric device is not limited to a device generating an oscillation signal such as a resonator or oscillator and may be one filtering signals like an acoustic wave device or may be a sensor detecting a physical quantity like a gyro sensor.

The piezoelectric material utilized for the piezoelectric element is not limited to a quartz crystal. From another viewpoint, it is not limited to a single crystal. For example, the piezoelectric material may be ceramic (polycrystal), single crystal of lithium tantalate, or single crystal of lithium niobate.

The temperature sensitive component is not limited to a temperature sensor in a narrow sense (temperature sensitive element or transducer). For example, the temperature sensitive component may have a function of processing an electrical signal obtained by converting temperature as well. As the processing, there can be mentioned for example amplification, modulation, filtering, and computation based on the detected temperature. In other words, the temperature sensitive component may be an integrated circuit (IC) including a temperature sensitive element as well.

The IC used as the temperature sensitive component described above, in a case where a piezoelectric element is a vibration element utilized for the resonator, may be one including an oscillation circuit which supplies voltage to the vibration element to generate an oscillation signal and a compensation circuit performing temperature compensation of the frequency characteristic of the vibration element based on the temperature detected by the temperature sensitive element as well. That is, the piezoelectric device may be a temperature compensation type oscillator.

In a case where the IC used as the temperature sensitive component described above has an oscillation circuit and compensation circuit, for example, the vibration element and the IC are connected, and the IC and the external terminals on the circuit board are connected. In other words, the vibration element and the external terminals are not directly connected. Further, the electrical signal which is output from the terminal of the IC (part terminal of the temperature sensitive component) through the conductive adhesive to the connection conductor (second mounting terminal 33B) is for example an oscillation signal and is not a signal including information of the temperature. As understood from this example, the electrical signal generated in accordance with the temperature in the temperature sensitive component need not always be output to the part terminal of the temperature sensitive component (from another viewpoint, the external portion of the temperature sensitive component) and may be utilized inside the temperature sensitive component.

The piezoelectric device is not limited to one having a pseudo H-shaped package which is configured by a combination of the package sealing the piezoelectric element and the circuit board on which this package is mounted. For example, the piezoelectric device may be one having an integrally formed H-shaped package as well. Specifically, this H-shaped package has a configuration where a frame is added to the lower part of the substrate part 29a in the mounting member 17 in the embodiment and where terminals corresponding to the mounting terminals 33 are provided on the lower surface of this frame. The temperature sensitive component is mounted in a region in the lower surface of the substrate part 29a which is surrounded by the frame by the conductive adhesives and is connected through the conductive adhesives with the connection conductors exposed in the surrounded region. As understood from this example, the connection conductors to which the conductive adhesives are bonded need not be ones corresponding to the mounting terminals 33 either.

In the embodiment, the conductive adhesives 9 were made thinner than the bonding materials 11 made of metal and were not directly bonded to the mounting pads 45 on the circuit board 7. However, the conductive adhesives may be directly bonded to the mounting pads as well. Further, in this case, the mounting terminals and the mounting pads may be bonded in parallel by the conductive adhesives and the bonding materials made of metal or may be bonded only by the conductive adhesives without the bonding materials made of metal.

In the embodiment, the conductive adhesives 9 were bonded to only parts of the mounting terminals 33. However, the conductive adhesives may also extend over the entire surfaces of the mounting terminals 33 as well. Further, the bonding materials 11 made of metal may be bonded to the mounting terminals 33 only through the conductive adhesives.

In the embodiment, at least a part of the bonding material 11 made of metal overlaps (is bonded with) the mounting terminal 33 while interposing the conductive adhesive 9 therebetween. However, the bonding material made of metal may be arranged so as not to overlap the conductive adhesive. For example, the bonding material may be positioned only on the inner side of the mounting terminal 33 from the terminal corresponding part 9a in the embodiment.

The mounting terminals positioned on the lower surface of the package may be provided in a number larger than four. For example, five or more mounting terminals may be arranged along the outer edge of the lower surface of the package as well.

Priority is claimed on Japanese application No. 2018-202021, filed on Oct. 26, 2018, the contents of which is incorporated herein by reference.

REFERENCE SIGNS LIST

1 . . . crystal device (piezoelectric device), 5 . . . temperature sensitive element (temperature sensitive component), 9 . . . conductive adhesive, 9B . . . second conductive adhesive (conductive adhesive), 15 . . . crystal element (piezoelectric element), 21 . . . package, 29 . . . base body, 29s . . . space, 29d . . . lower surface (predetermined surface) of base body, 33B . . . second mounting terminal (connection conductor), and 41 . . . part terminal (element terminal).

The invention claimed is:
1. A piezoelectric device comprising
a piezoelectric element,
a package which comprises
    a base body having electric insulation and configuring a space which is sealed and holds the piezoelectric element and
    a connection conductor located on a predetermined surface of the base body, the predetermined surface being on an outer side relative to the space,
a temperature sensitive component which comprises a part terminal and converts temperature to an electrical signal, and
a conductive adhesive which is configured by a thermosetting resin containing a conductive filler and is bonded to the connection conductor and the part terminal, wherein
in a plan view of the predetermined surface, the part terminal and the connection conductor are separated from each other,
the conductive adhesive comprises
    an element corresponding part which is bonded to the part terminal and
    a wiring part which connects the element corresponding part and the connection conductor, and
the element corresponding part and the wiring part directly contact the predetermined surface having electric insulation.

2. The piezoelectric device according to claim 1, further comprising an underfill filled between the predetermined surface and the temperature sensitive component.

3. The piezoelectric device according to claim 1, further comprising a circuit board, wherein
the circuit board comprises
    a first surface facing the predetermined surface,
    a second surface on a back of the first surface,
    an opening which penetrates from the first surface to the second surface and holds the temperature sensitive component,
    a mounting pad which is located on the first surface, faces the connection conductor, and is bonded to it through a conductive bonding material, and
    an external terminal which are located on the second surface and is electrically connected with the mounting pad.

4. The piezoelectric device according to claim 1, further comprising a circuit board, wherein
the circuit board comprises
    a first surface facing the predetermined surface,
    a second surface on a back of the first surface,
    an opening which penetrates from the first surface to the second surface and holds the temperature sensitive component,
    a mounting pad which is located on the first surface, faces the connection conductor, and is bonded to it through a conductive bonding material, and
    an external terminal which are located on the second surface and is electrically connected with the mounting pad,
the temperature sensitive component comprises a pair of the part terminals,
the package comprises a pair of the connection conductors,
the piezoelectric device comprises a pair of the conductive adhesives which individually connect the pair of part terminals and the pair of connection conductors, and
the pair of conductive adhesives comprise mutually point symmetrical shapes relative to a geometric center of the opening in a region where they overlap the opening.

5. The piezoelectric device according to claim 3, wherein
the bonding material is made of metal and is bonded to the mounting pad between the mounting pad and the connection conductor, and
the conductive adhesive is interposed between at least a part of the connection conductor and the bonding material and is bonded to the two.

6. The piezoelectric device according to claim 3, wherein
the bonding material is bonded to the mounting pad between the mounting pad and the connection conductor,
the conductive adhesive comprises a first part which follow along at least a portion of a edge part of the connection conductor in a plan view of the predetermined surface, and
the bonding material is bonded to the connection conductor at a position being on an inner side of the connection conductor relative to the first part in a plan view of the predetermined surface.

7. The piezoelectric device according to claim 6, wherein
the package comprises a plurality of mounting terminals including the connection conductor on the predetermined surface, and
the first part follow along at least a part of a portion of an outer edge of the connection conductor, the portion of the outer edge being on a side of the other mounting terminal other than the connection conductor.

8. The piezoelectric device according to claim 7, wherein, in each of all of the mounting terminals, either of the first part of the conductive adhesive which is bonded to the part terminal or an other conductive adhesive which is not bonded to the part terminal is located following along at least a part of a portion of an outer edge of the mounting terminal, the portion of the outer edge being on a side of the other mounting terminal.

9. The piezoelectric device according to claim 5, wherein
the conductive adhesive comprises a first part which follow along at least a portion of an edge part of the connection conductor in a plan view of the predetermined surface, and
the bonding material is bonded to the connection conductor at a position being on an inner side of the connection conductor relative to the first part in a plan view of the predetermined surface.

10. The piezoelectric device according to claim 9, wherein
the package comprises a plurality of mounting terminals including the connection conductor on the predetermined surface, and
the first part follows along at least a part of a portion of an outer edge of the connection conductor, the portion of the outer edge being on a side of the other mounting terminal other than the connection conductor.

11. The piezoelectric device according to claim 10, wherein, in each of all of the mounting terminals, either of the first part of the conductive adhesive which is bonded to the part terminal or an other conductive adhesive which is not bonded to the part terminal is located following along at least a part of a portion of an outer edge of the mounting terminal, the portion of the outer edge being on a side of the other mounting terminal.

12. The piezoelectric device according to claim 5, further comprising a circuit board, wherein
the temperature sensitive component comprises a pair of the part terminals,
the package comprises a pair of the connection conductors,
the piezoelectric device comprises a pair of the conductive adhesives which individually connect the pair of part terminals and the pair of connection conductors, and
the pair of conductive adhesives comprise mutually point symmetrical shapes relative to a geometric center of the opening in a region where they overlap the opening.

13. The piezoelectric device according to claim 6, further comprising a circuit board, wherein
the temperature sensitive component comprises a pair of the part terminals,
the package comprises a pair of the connection conductors,
the piezoelectric device comprises a pair of the conductive adhesives which individually connect the pair of part terminals and the pair of connection conductors, and
the pair of conductive adhesives comprise mutually point symmetrical shapes relative to a geometric center of the opening in a region where they overlap the opening.

14. A piezoelectric device comprising
a piezoelectric element,
a package which comprises
a base body having electric insulation and configuring a space which is sealed and holds the piezoelectric element and
a connection conductor located on a predetermined surface of the base body, the predetermined surface being on an outer side relative to the space,
a temperature sensitive component which comprises a part terminal and converts temperature to an electrical signal, and
a conductive adhesive which is configured by a thermosetting resin containing a conductive filler and is bonded to the connection conductor and the part terminal, wherein
the circuit board comprises
a first surface facing the predetermined surface,
a second surface on a back of the first surface,
an opening which penetrates from the first surface to the second surface and holds the temperature sensitive component,
a mounting pad which is located on the first surface, faces the connection conductor, and is bonded to it through a conductive bonding material, and
an external terminal which are located on the second surface and is electrically connected with the mounting pad.

15. The piezoelectric device according to claim 14, further comprising an underfill filled between the predetermined surface and the temperature sensitive component.

16. The piezoelectric device according to claim 14, further comprising a circuit board, wherein
the temperature sensitive component comprises a pair of the part terminals,
the package comprises a pair of the connection conductors,
the piezoelectric device comprises a pair of the conductive adhesives which individually connect the pair of part terminals and the pair of connection conductors, and
the pair of conductive adhesives comprise mutually point symmetrical shapes relative to a geometric center of the opening in a region where they overlap the opening.

17. The piezoelectric device according to claim 14, wherein
the bonding material is made of metal and is bonded to the mounting pad between the mounting pad and the connection conductor, and
the conductive adhesive is interposed between at least a part of the connection conductor and the bonding material and is bonded to the two.

18. The piezoelectric device according to claim 14, wherein the bonding material is bonded to the mounting pad between the mounting pad and the connection conductor, the conductive adhesive comprises a first part which follow along at least a portion of an edge part of the connection conductor in a plan view of the predetermined surface, and the bonding material is bonded to the connection conductor at a position being on an inner side of the connection conductor relative to the first part in a plan view of the predetermined surface.

19. The piezoelectric device according to claim 18, wherein the package comprises a plurality of mounting terminals including the connection conductor on the predetermined surface, and the first part follows along at least a part of a portion of an outer edge of the connection conductor, the portion of the outer edge being on a side of the other mounting terminal other than the connection conductor.

20. The piezoelectric device according to claim 19, wherein, in each of all of the mounting terminals, either of the first part of the conductive adhesive which is bonded to the part terminal or an other conductive adhesive which is not bonded to the part terminal is located following along at least a part of a portion of an outer edge of the mounting terminal, the portion of the outer edge being on a side of the other mounting terminal.

* * * * *